United States Patent
Lin et al.

(10) Patent No.: US 9,659,974 B2
(45) Date of Patent: May 23, 2017

(54) PIXEL STRUCTURE, MANUFACTURING METHOD OF PIXEL STRUCTURE, ARRAY SUBSTRATE, AND DISPLAY PANEL

(71) Applicants: Shanghai AVIC OPTO Electronics Co., Ltd., Shanghai (CN); Tianma Micro-Electronics Co., Ltd., Shenzhen (CN)

(72) Inventors: Yao Lin, Shanghai (CN); Dandan Qin, Shanghai (CN); Zhaokeng Cao, Shanghai (CN); Yinghua Mo, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/016,034

(22) Filed: Feb. 4, 2016

(65) Prior Publication Data

US 2016/0155756 A1    Jun. 2, 2016

Related U.S. Application Data

(63) Continuation of application No. 14/692,714, filed on Apr. 21, 2015, now Pat. No. 9,268,190.

(30) Foreign Application Priority Data

Oct. 10, 2014    (CN) .......................... 2014 1 0531217

(51) Int. Cl.
*G02F 1/1343*    (2006.01)
*H01L 29/04*    (2006.01)
(Continued)

(52) U.S. Cl.
CPC .......... *H01L 27/124* (2013.01); *G02F 1/1368* (2013.01); *G02F 1/134336* (2013.01);
(Continued)

(58) Field of Classification Search
CPC ............. G02F 1/134363; H01L 27/136; H01L 27/14603
(Continued)

(56) References Cited

U.S. PATENT DOCUMENTS 9,318,040 B1 * 4/2016 Tsai .......................... G02F 1/13
2009/0128727 A1 * 5/2009 Yata .................. G02F 1/134363
349/46

(Continued)

FOREIGN PATENT DOCUMENTS

CN    101441369 A    5/2009
CN    101726908 A    6/2010
(Continued)

*Primary Examiner* — David Vu
*Assistant Examiner* — Brandon Fox
(74) *Attorney, Agent, or Firm* — Faegre Baker Daniels LLP

(57) ABSTRACT

The disclosure provides a pixel structure, a manufacturing method of a pixel structure, an array substrate, a display panel, and a display device. The pixel structure includes a plurality of data lines and a plurality of scan lines, and a plurality of pixel units formed by intersecting the plurality of data lines with the plurality of scan lines. A pixel unit corresponds to one of the plurality of data lines and one of the plurality of scan lines. The pixel unit includes a pixel electrode and a TFT. The pixel electrode of the pixel unit in a row is electrically connected to a TFT of a pixel unit in a preceding adjacent row of the pixel electrode of the pixel unit.

20 Claims, 11 Drawing Sheets

(51) Int. Cl.
*H01L 27/12* (2006.01)
*G02F 1/1368* (2006.01)
*G02F 1/1362* (2006.01)
*H01L 27/32* (2006.01)
*H01L 27/146* (2006.01)

(52) U.S. Cl.
CPC .. *G02F 1/134363* (2013.01); *G02F 1/136286* (2013.01); *H01L 27/1259* (2013.01); *H01L 27/14603* (2013.01); *H01L 27/326* (2013.01); *G02F 2201/52* (2013.01)

(58) Field of Classification Search
USPC ...................................... 257/59, 72; 349/141
See application file for complete search history.

(56) References Cited

U.S. PATENT DOCUMENTS

| | | | | |
|---|---|---|---|---|
| 2010/0103360 | A1* | 4/2010 | Shimomaki | G02F 1/133707 349/141 |
| 2012/0099066 | A1* | 4/2012 | Ougiichi | G02F 1/133345 349/138 |
| 2012/0176563 | A1* | 7/2012 | Adachi | G02F 1/133536 349/62 |
| 2014/0217411 | A1* | 8/2014 | Jiang | H01L 27/124 257/59 |
| 2015/0116644 | A1* | 4/2015 | Morishita | G02F 1/134363 349/138 |
| 2015/0380435 | A1* | 12/2015 | Li | G09G 3/3614 349/43 |

FOREIGN PATENT DOCUMENTS

| | | |
|---|---|---|
| CN | 103116238 A | 5/2013 |
| CN | 103926768 A | 7/2014 |
| CN | 104090440 A | 10/2014 |
| JP | 2014041366 A | 3/2014 |
| KR | 20110044107 A | 4/2011 |
| WO | 2013168566 A1 | 11/2013 |

* cited by examiner

PIXEL STRUCTURE, MANUFACTURING METHOD OF PIXEL STRUCTURE, ARRAY SUBSTRATE, AND DISPLAY PANEL

CROSS-REFERENCE TO RELATED APPLICATION

This application is a continuation of U.S. application Ser. No. 14/692,714, filed Apr. 21, 2015, which claims priority to Chinese Patent Application No. 201410531217.5, filed on Oct. 10, 2014, all of which are herein incorporated by reference in their entirety.

TECHNICAL FIELD

The present application relates to a field of display technologies, in particular, to a pixel structure, a manufacturing method of a pixel structure, an array substrate, and a display panel.

BACKGROUND

With the development of display technologies, Liquid Crystal Display (LCD) devices have been widely used, and the display effect of the LCD devices is improved continuously.

A pixel structure located on a Thin Film Transistor (TFT) array substrate is an important part of the LCD device. Different pixel structures enable the LCD device to have different display effects. FIG. 1 is a schematic structure diagram of a pixel structure in the related art. As shown in FIG. 1, in the related art, the pixel structure of the LCD device includes a plurality of data lines 11, a plurality of scan lines 12, a plurality of pixel units 13 formed by intersecting the plurality of data lines 11 with the plurality of scan lines 12, and a TFT 14 and a pixel electrode 15 located in each of the pixel units 13. Each of the pixel electrodes 15 includes a plurality of slits 151, and each of the slits 151 includes two ends (a upper end and lower end of the slit in FIG. 1) both having a corner A1. Additionally, an area A2 is the area covered by a black matrix on a color filter substrate in correctly adhering the color filter substrate onto a TFT array substrate.

It can be seen from FIG. 1, the black matrix covers a part of the corner A1 of the slits 151 and the remaining part of the corner A1 is located in an open area in the case of correctly adhering the color filter substrate onto the TFT array substrate. In at least some instances, more parts of the corner A1 are located in the open area in the case of deviating the color filter substrate from the TFT array substrate in adhering. The electric field formed by the corner A1 of the slits 151 is different on controlling the direction of the liquid crystal molecules from the electric field formed by the remaining part of the slits 151 other than the corner A1, where the electric field formed by the corner A1 of the slits 151 will cause a reduced light transmittance as compared to the electric filed formed by the remaining part other than the corner A1 of the slits 151 in displaying of the liquid crystal display device. In addition, if more parts of the corner A1 of the slits 151 are located in the open area, a risk of a trace mura of the image displayed on the LCD device would also be increased.

SUMMARY

The present disclosure provides a pixel structure, a manufacturing method of a pixel structure, an array substrate, and a display panel, in order to solve the problem in the related art that the light transmittance is reduced due to the corners of the slits located in the open area while also increasing a high risk of a trace mura of the image displayed on the LCD device.

Embodiments of the disclosure provide a pixel structure, including:

a plurality of data lines and a plurality of scan lines;

a plurality of pixel units formed by intersecting the plurality of data lines with the plurality of scan lines, wherein a pixel unit from the plurality of pixel units corresponds to one of the plurality of data lines and one of the plurality of scan line;

the pixel units includes a pixel electrode and a thin film transistor, the pixel electrode include a plurality of slits, with at least one of the plurality of slits having a corner;

wherein, a pixel electrode of a pixel unit in a row is electrically connected to a thin film transistor of a pixel unit in a preceding adjacent row of the pixel electrode of the pixel unit, and the corner of the pixel electrode close to the thin film transistor extends toward the thin film transistor.

Embodiments of the disclosure further provide a manufacturing method of a pixel structure, including:

forming a plurality of thin film transistors;

forming a plurality of data lines and a plurality of scan lines, wherein a plurality of pixel units are formed by intersecting the plurality of data lines with the plurality of scan lines, and each of the pixel units includes a thin film transistor;

forming a plurality of pixel electrodes, with a pixel electrode being located in a pixel unit, wherein the pixel electrode includes a plurality of slits, with at least one of the slits having a corner, and wherein, a pixel electrode of a pixel unit in a row is electrically connected to a thin film transistor of a pixel unit in a preceding adjacent row of the pixel electrode of the pixel unit, and the corner of the pixel electrode close to the thin film transistor extends toward the thin film transistor.

Embodiments of the disclosure further provide an array substrate, including the above pixel structure.

Embodiments of the disclosure further provide a display panel, including the above array substrate.

Embodiments of the disclosure further provide a display device, including the above display panel.

In the pixel structure, the manufacturing method of the pixel structure, the array substrate, the display panel, and the display device according to the embodiments of the disclosure, in a column of pixel units, a pixel electrode of each pixel unit in a row is electrically connected to a thin film transistor of a pixel unit in a preceding adjacent row, and the corner of the pixel electrode close to the thin film transistor extends toward the thin film transistor, and thus, the corner close to the thin film transistor can be completely covered by a black matrix in the color filter substrate after the color filter substrate is adhered onto the array substrate, so that the number of the corners on the open area is reduced, and hence the light transmittance is improved while also decreasing a risk of a trace mura of the displayed image, thereby improving the display effect of the display panel and display device.

While multiple embodiments are disclosed, still other embodiments will become apparent to those skilled in the art from the following detailed description, which shows and describes illustrative embodiments of the disclosure.

Accordingly, the drawings and detailed description are to be regarded as illustrative in nature and not restrictive.

BRIEF DESCRIPTION OF THE DRAWINGS

Other features, objects and advantages of the disclosure will become apparent from the following detailed description made to nonrestrictive embodiments with reference to the accompanying drawings below, in which.

Figure 1:
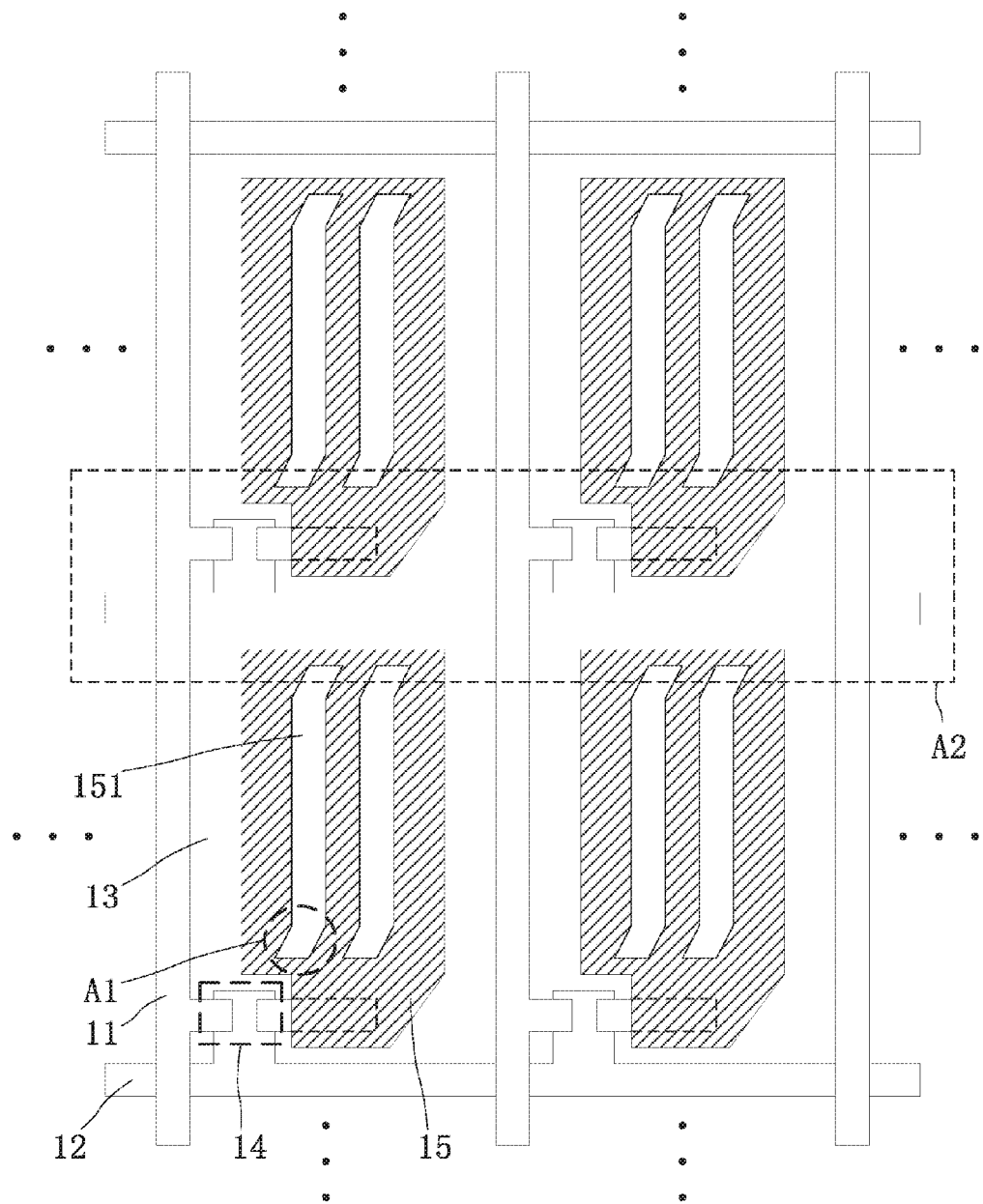
FIG. 1 is a schematic diagram of the structure of a pixel structure in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The present disclosure will be further illustrated in detail below in conjunction with the accompanying drawings and embodiments. It may be understood that specific embodiments described herein are merely for explaining the disclosure rather than limiting the disclosure. Additionally, it is noted that merely partial contents associated with the disclosure rather than all contents are illustrated in the accompanying drawings for ease of description.

Figure 2:
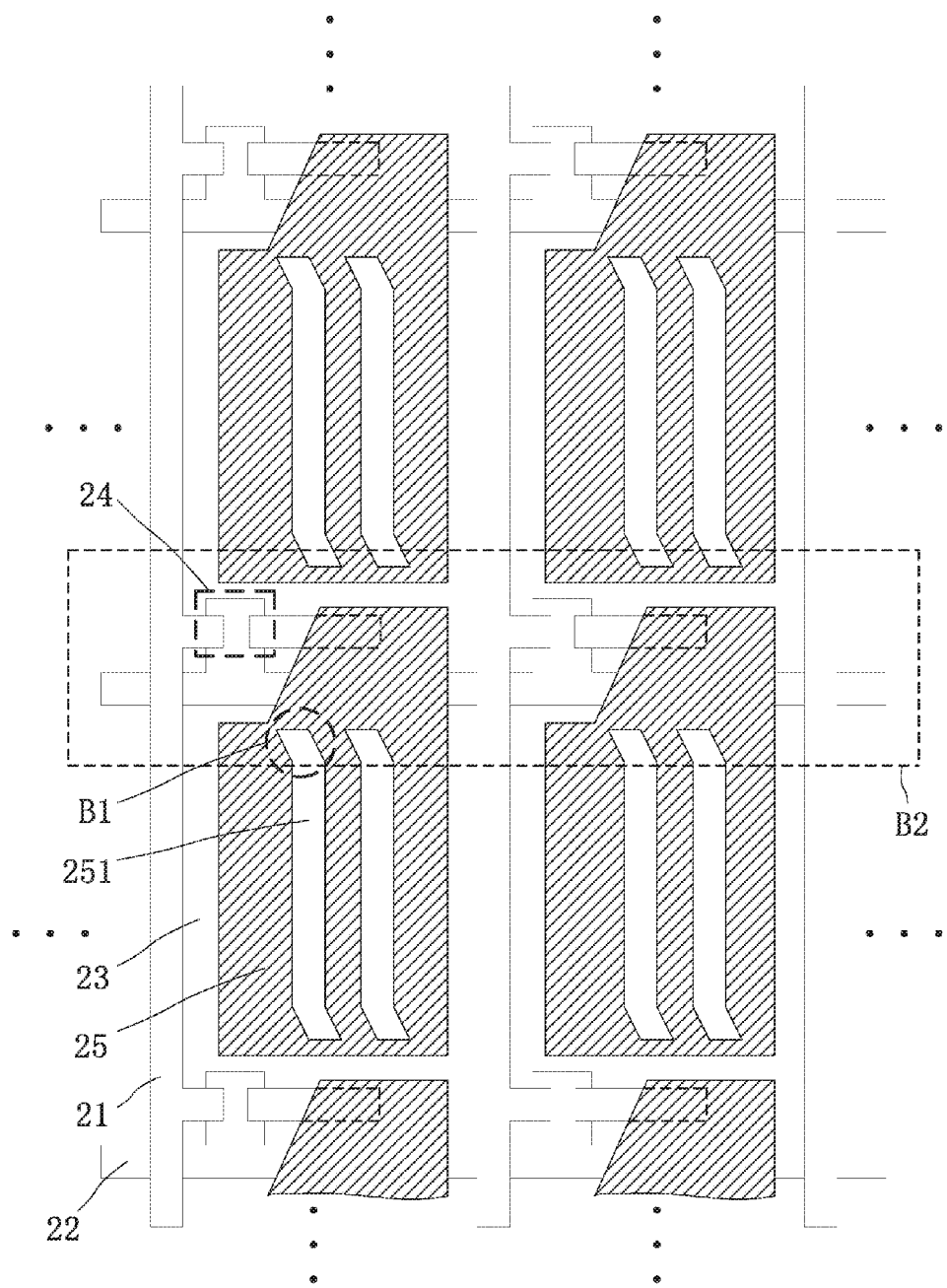
FIG. 2 is a schematic diagram of the structure of a pixel structure according to embodiments described in the disclosure.

Embodiment of the disclosure provide a pixel structure. FIG. 2 is a schematic diagram of the structure of a pixel structure according to embodiments described in the disclosure. The pixel structure includes a plurality of data lines 21, a plurality of scan lines 22, and a plurality of pixel units 23 formed by intersecting the plurality of data lines 21 with the plurality of scan lines 22, where each of the pixel units 23 corresponds to one of the plurality of data lines 21 and one of the plurality of scan lines 21; and each of the pixel units 23 includes a pixel electrode 25 and a thin film transistor 24 therein. The pixel electrode 25 includes a plurality of slits 251, with at least one of the plurality of slits 251 having a corner B1. In a column of pixel units 23, the pixel electrode 25 of each pixel unit 23 in a row is electrically connected to the thin film transistor 24 of the pixel unit 23 in a preceding adjacent row, and the corner B1 of the pixel electrode 25 close to the thin film transistor 24 extends toward the thin film transistor 24.

It should be noted that the pixel electrode of the pixel unit and the thin film transistor electrically connected with and configured for controlling the pixel electrode are used for implementing the display of the pixel unit. The thin film transistor controls the pixel electrode, and hence the thin film transistor controls the pixel unit including the pixel electrode. The scan line electrically connected with the gate electrode of the thin film transistor can turn on or turn off the thin film transistor. The data line electrically connect with the source electrode of the thin film transistor, and the data line can provide a data signal for the pixel electrode electrically connected with the thin film transistor, when the thin film transistor is turned on. Based on this, each of the above pixel units 23 corresponds to one of the data lines 21 and one of the scan lines 22. Namely, the data line 21 corresponding to the pixel unit 23 is the one electrically connected with the thin film transistor 24 for controlling the pixel unit 23; and the scan line 22 corresponding to the pixel unit 23 is the one electrically connected with the thin film transistor 24 for controlling the pixel unit 23.

In a column of pixel units, the pixel electrode 25 of each pixel unit 23 in a row is electrically connected to a thin film transistor 24 of the pixel unit 23 in the preceding adjacent row, and the corner B1 of the pixel electrode 25 close to the thin film transistor 24 extends toward said thin film transistor 24, and thus the corner B1 close to the thin film transistor 24 can be completely covered by the black matrix in the color filter substrate after the color filter substrate is adhered to the array substrate. With such pixel structure, the number of the corners of the pixel electrode in the open area is reduced, and accordingly, the light transmittance is improved and a risk of a trace mura of the image displayed on the LCD device is decreased, as compared with the related art.

In the pixel structure as shown in FIG. 2, the pixel units are arranged as a matrix. In addition, the pixel units can alternatively be arranged in a staggered way. Namely, in a column of pixel units, each pixel unit in a row is staggered to one side from a pixel unit in an adjacent row by a half width of pixel unit. The pixel structure in FIG. 3 is different from the pixel structure in FIG. 2 in that, the pixel electrode 25 of the pixel unit 23 in a row is electrically connected to the thin film transistor 24 of the pixel unit in a preceding adjacent row of the pixel electrode 25 of the pixel unit 23, and the thin film transistor 24 of the pixel unit in a preceding adjacent row is located at left side of the pixel electrode 25 of the pixel unit 23 in the row, and the corner B1 of the pixel electrode 25 close to the thin film transistor 24 extends toward the thin film transistor 24. Additionally, an area B2 in FIG. 3A is the area covered by a black matrix on a color filter substrate which is correctly adhered onto a TFT array substrate.

Figure 3A:
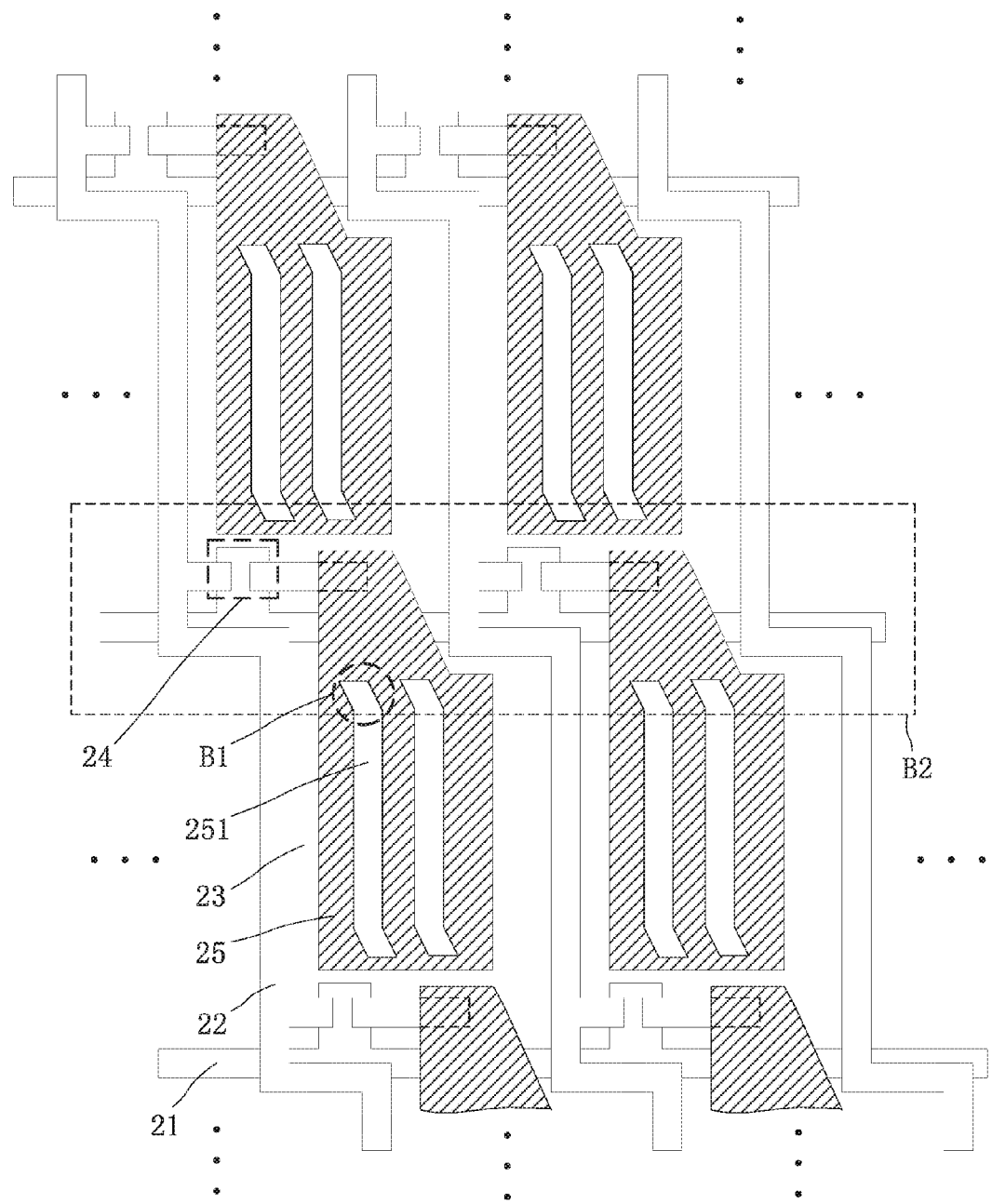
FIG. 3A is a schematic diagram of the structure of another pixel structure according to embodiments described in the disclosure.

Referring to FIG. 3A, the corner B1 above the pixel electrode 25 bends toward the thin film transistor 24 electrically connected to said pixel electrode 25. As such, the corner B1 can even more extend toward the corresponding thin film transistor 24, allowing the corner B1 to be better covered by the black matrix of the color filter substrate.

Figure 3B:
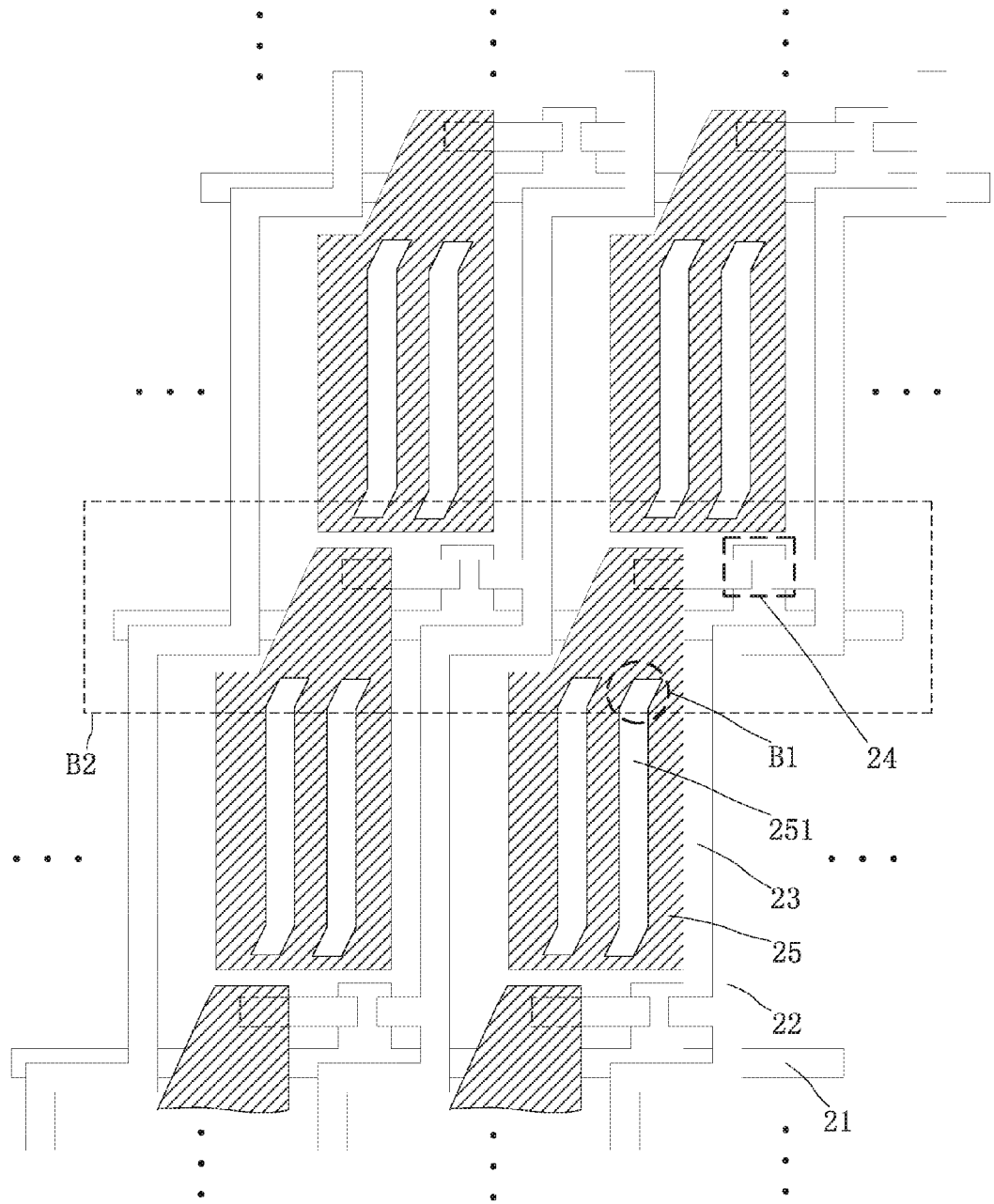
FIG. 3B is a schematic diagram of the structure of another pixel structure according to embodiments described in the disclosure.

FIG. 3A is an example of the pixel structure formed by arranging the pixel units in the staggered way. In another example, the pixel structure of FIG. 3B is different from the pixel structure of FIG. 3A in that, a pixel electrode 25 of each pixel unit 23 is electrically connected to a thin film transistor 24 of a pixel unit 23 in a preceding adjacent row of the pixel electrode 25, and the thin film transistor 24 of the pixel unit in a preceding adjacent row is located at right side of the pixel electrode 25 of the pixel unit 23 in the row, and the corner B2 of the pixel electrode 25 close to the thin film transistor 24 extends toward the thin film transistor 24. In FIG. 3B, similarly, the corner B1 above the pixel electrode 25 bends toward the thin film transistor 24 electrically connected to said pixel electrode 25.

Figure 4:
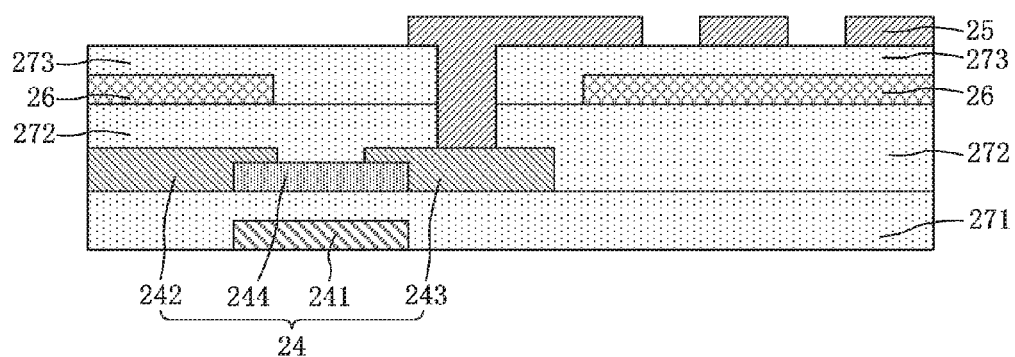
FIG. 4 is a schematic diagram of the structure of another pixel structure according to embodiments described in the disclosure.

Based on the pixel structure described above, a pixel structure in embodiments of the disclosure further includes a common electrode 26, as shown in FIG. 4. The common electrode 26 is located between the pixel electrode 25 and a film layer, the film layer includes a source electrode 242 and a drain electrode 243 of the thin film transistor 24 electrically connected with the pixel electrode 25, and the common electrode 26 is electrically insulated from the pixel electrode 25 via a third insulating layer 273 and is electrically insulated from the source electrode 242 and the drain electrode 243 via a second insulating layer 272. Additionally, as shown in FIG. 4, the gate electrode 241 is covered by a first insulating layer 271; an active layer 244 is located on the first insulating layer 271; the source electrode 242 and drain electrode 243 are separately arranged on two lateral sides of the active layer 244 and electrically connected to the active layer 244; the source electrode 242, the drain electrode 243, and the active layer 244 are insulated from the gate electrode 241 via the first insulating layer 271, and the drain electrode 243 is electrically connected to the pixel electrode 253.

Because the pixel electrode 25 overlaps with the scan line 24 corresponding to the thin film transistor 24 electrically connected with the pixel electrode 25, affection on electric signal might be generated at the overlapped area during working. Therefore, the common electrode 26 is located between the pixel electrode 25 and the source electrode 242 and the drain electrode 243 of the thin film transistor 24 can have a function of shielding the electric signal at the overlapped area between the pixel electrode 25 and the scan line 22.

It should be noted that, the arrangement of the gate electrode 241 of the thin film transistor 24 as shown in FIG. 4 where the gate electrode 241 is arranged below the source electrode 242 and drain electrode 243 is just one example. In other examples, the gate electrode 241 can alternatively be arranged above the source electrode 242 and drain electrode 243, which is not limited thereto.

Figure 5A:
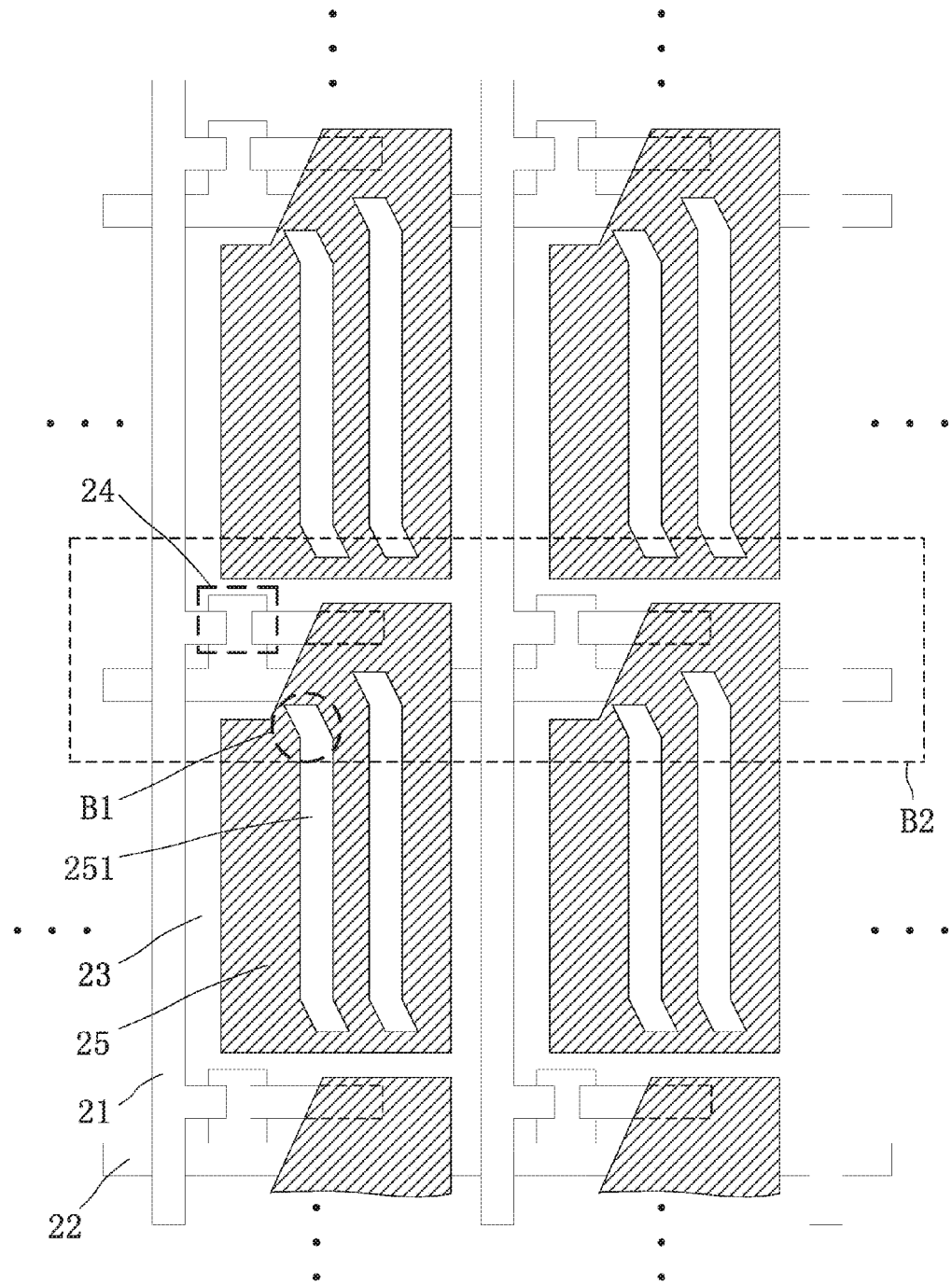
FIG. 5A is a schematic diagram of the structure of another pixel structure according to embodiments described in the disclosure.
Figure 5B:
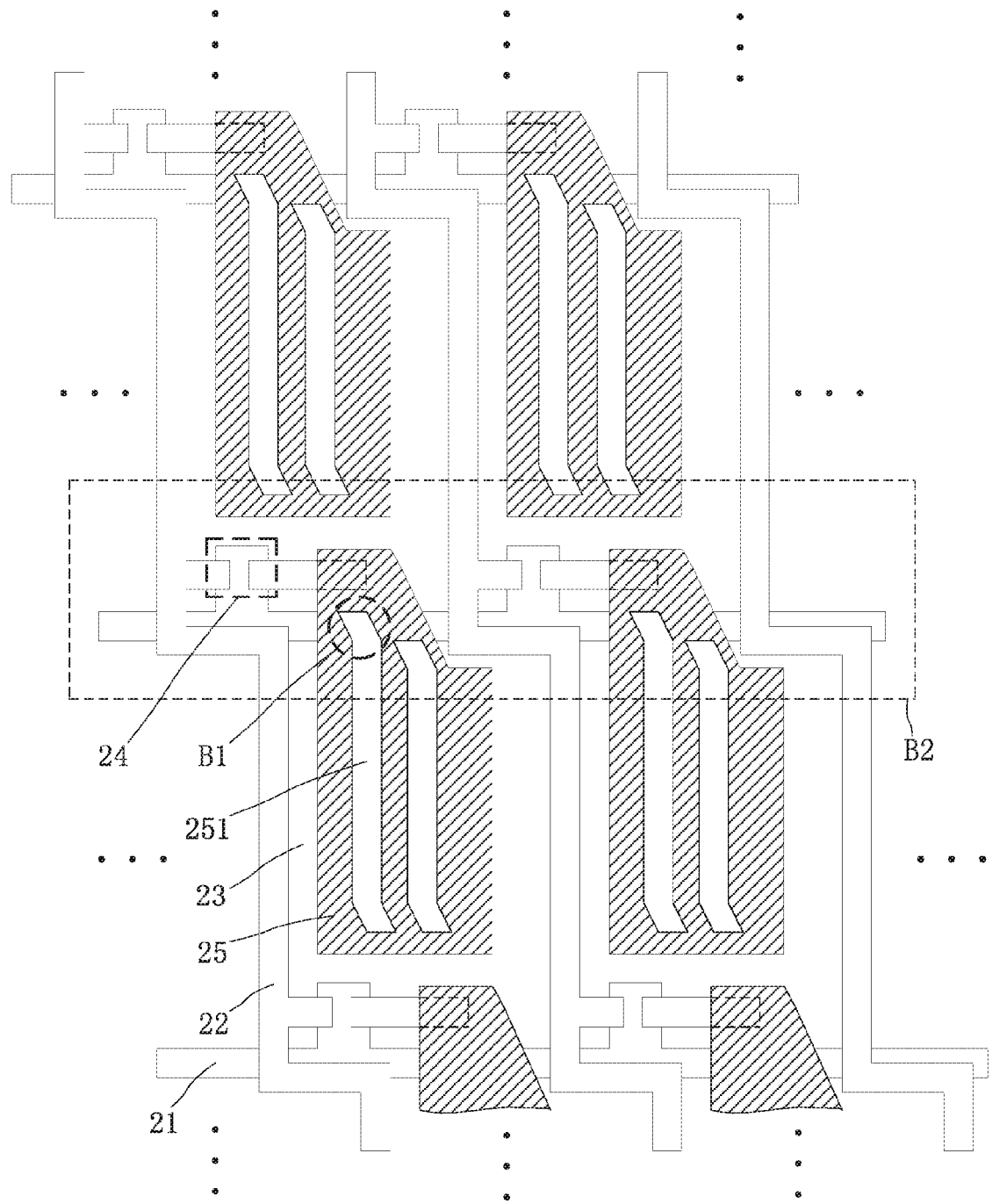
FIG. 5B is a schematic diagram of the structure of another pixel structure according to embodiments described in the disclosure.
Figure 5C:
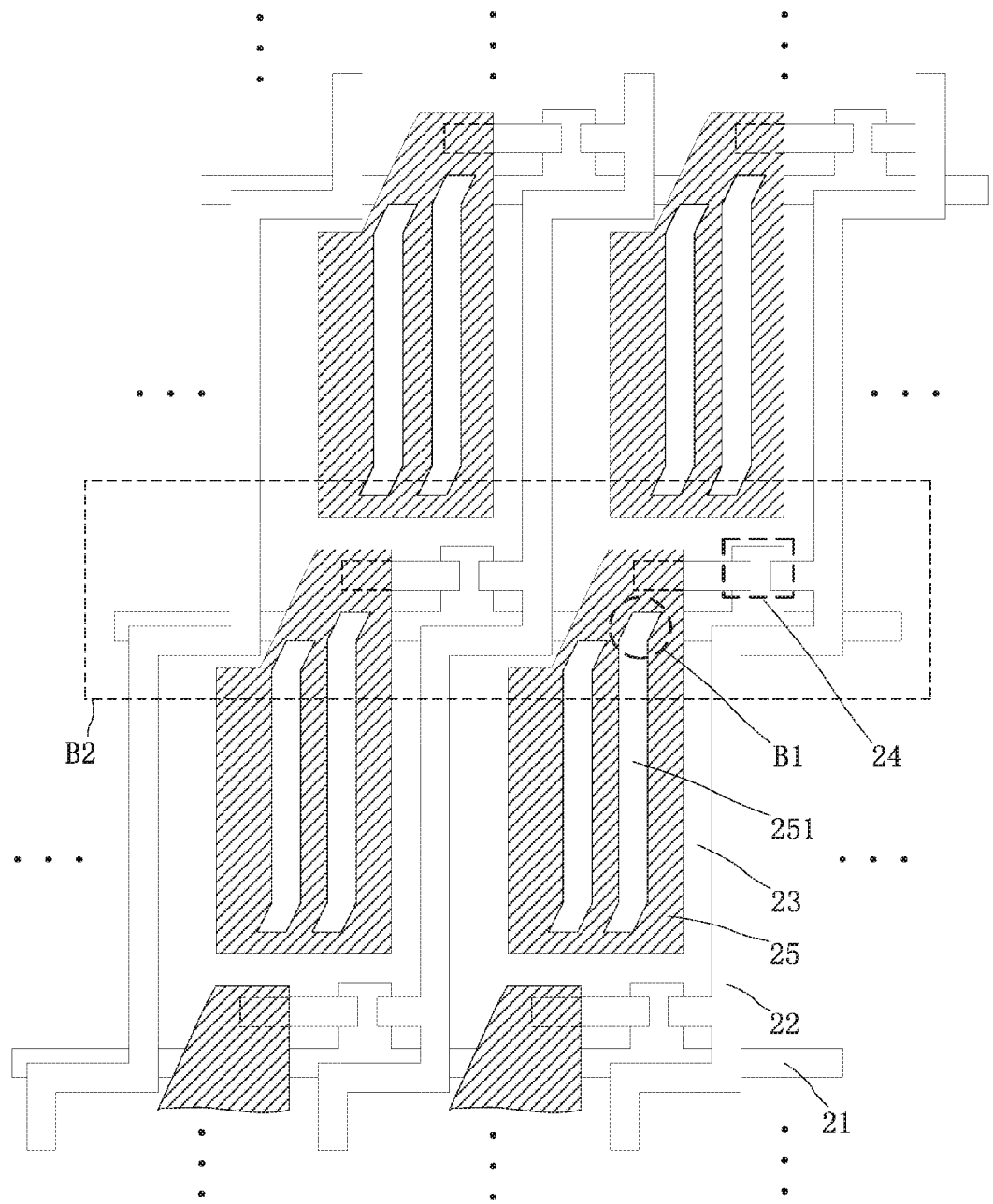
FIG. 5C is a schematic diagram of the structure of another pixel structure according to embodiments described in the disclosure.

In embodiments of the disclosure, further in a column of pixel units, a corner of a pixel electrode of each pixel unit in a row, which is close to a thin film transistor of a pixel unit in a preceding adjacent row, overlaps and is insulated from the scan line configured for controlling the thin film transistor. For example, in the pixel structures of FIGS. 5A to 5C corresponding to the pixel structures of FIG. 2, FIGS. 3A, and 3B, respectively, a corner B1 above the electrode 25 overlaps with and is insulated from the scan line 22 corresponding to the thin film transistor 24 electrically connected with the pixel electrode 25. The corner B1 extends towards the thin film transistor electrically connected with the pixel electrode 25 including the corner B1 and overlaps with the scan line 22 configured for controlling the thin film transistor 24, so that the corner B1 can be better covered by the black matrix of the color filter substrate, and hence the corner B1 can be completely covered by the black matrix in a light transmitting direction, thereby improving light transmittance of the pixel structure as well as decreasing a risk of a trace mura of the displayed image.

Figure 6A:
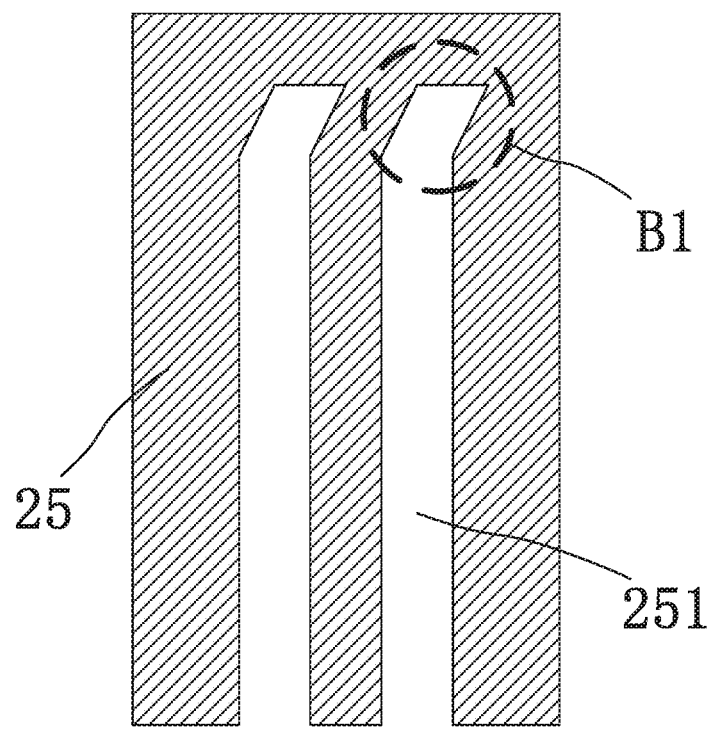
FIG. 6A is a schematic diagram of the structure of a pixel electrode according to embodiments described in the disclosure.

In embodiments of the disclosure, the pixel electrode is finger shaped optionally. As shown in FIG. 6A, the pixel electrode 25 is finger shaped. One end of the slit 251 of the pixel electrode 25 (an upper end of the slit 251 in FIG. 6A) has the corner B1, the other end of the slit 251 (a lower end of the slit 251 in FIG. 6A) has no corner B1. An end of the pixel electrode 25 which has the corner B1 is electrically connected with the thin film transistor 24 of the pixel unit 23 in a preceding row and adjacent to a pixel unit 23 including the pixel electrode 25. The corner B1 extends towards the thin film transistor 24, so that the corner B1 can be completely covered by the black matrix of the color filter substrate without location of the corner B1 in the opening area, thereby further improving light transmittance of the pixel structure as well as decreasing a risk of a trace mura of the displayed image.

Figure 6B:
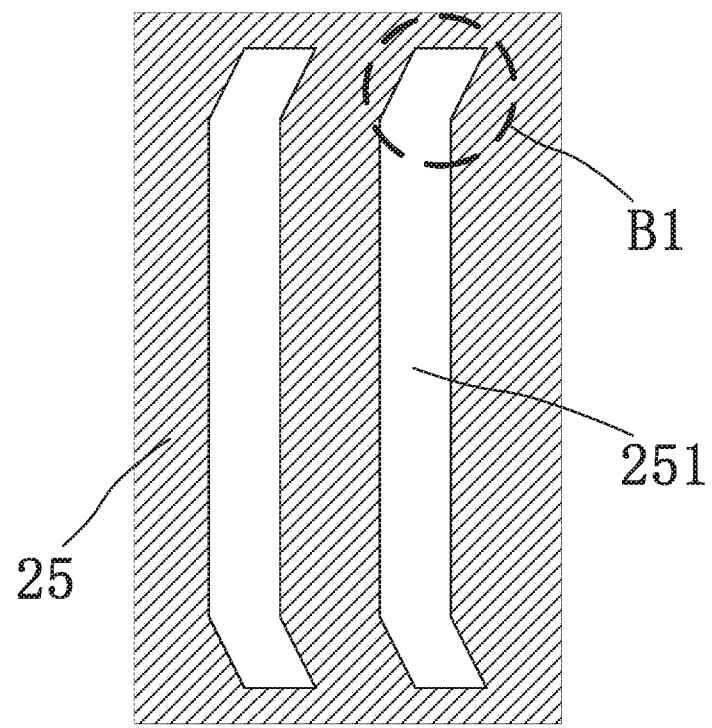
FIG. 6B is a schematic diagram of the structure of another pixel electrode according to embodiments described in the disclosure.
Figure 6C:
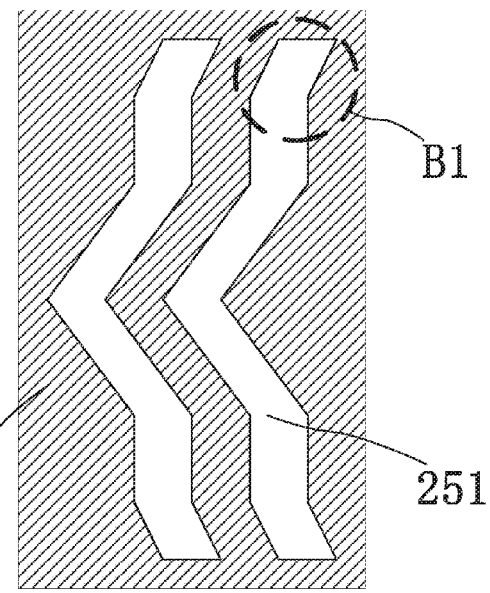
FIG. 6C is a schematic diagram of the structure of another pixel electrode according to embodiments described in the disclosure.

It should be noted that, in addition to the above structures of the pixel electrode, the structure of the pixel electrode can also be designed in other manners. For example, as shown in FIG. 6B, two ends of the slits 251 of the pixel electrode 25 each have a corner B1 which bends towards the same side, such as a right side. Alternatively, as shown in FIG. 6C, two ends of the slits 251 of the pixel electrode 25 each have a corner B1 which bends towards the right side, and in addition, the slits in FIG. 6C is different from that in FIG. 6B in that it further includes a V shaped structure so that a double domain structure of the pixel electrode 25 is formed.

In embodiments of the disclosure, the source electrode of the thin film transistor is electrically connected to the data line corresponding to the pixel unit including the thin film transistor; and the gate electrode of the thin film transistor is electrically connected to the scan line corresponding to the pixel unit including the thin film transistor. With such electrical connections for the thin film transistor, in a column of pixel units, a pixel electrode of each pixel unit in a row is electrically connected to a thin film transistor of a pixel unit in a preceding adjacent row.

In embodiments of the disclosure, a distance between a pixel electrode and a pixel electrode of a pixel unit including the thin film transistor electrically connected with the pixel electrode is greater than or equal to 4 μm and less than or equal to 6 μm. By setting the distance between a pixel electrode and a pixel electrode of a pixel unit including the thin film transistor electrically connected with said pixel electrode in such a range from 4 μm to 6 μm, the number of the corners in the opening area can be reduced while avoiding interference of the field signals between a pixel electrode and a pixel electrode of a pixel unit including the thin film transistor electrically connected with said pixel electrode.

Figure 7:
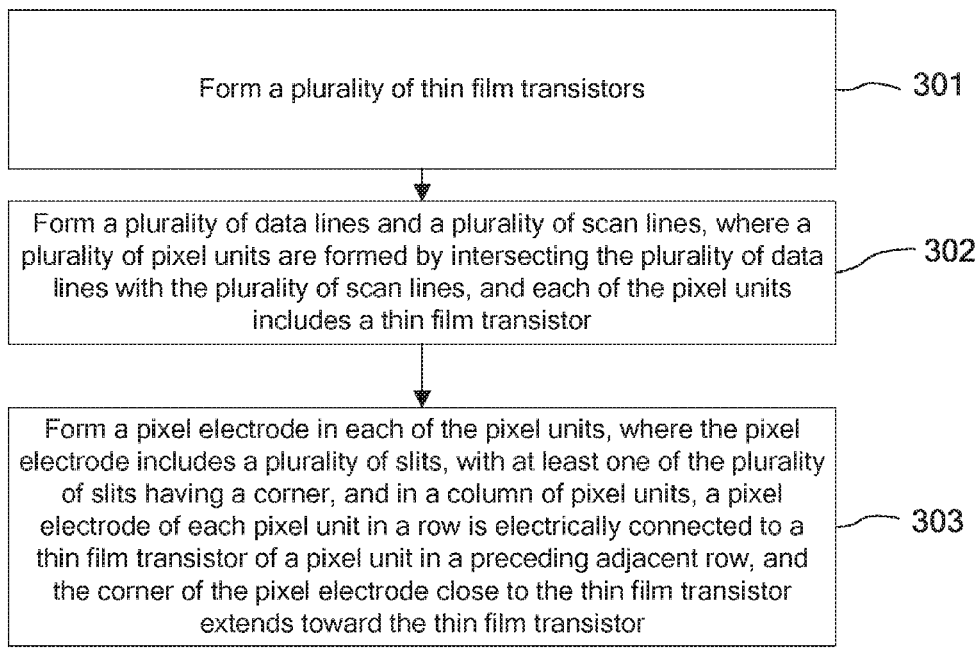
FIG. 7 is a schematic flowchart of a manufacturing method of a pixel structure according to embodiments described in the disclosure.

Embodiments further provide a manufacturing method of a pixel structure. FIG. 7 is a schematic flowchart of a manufacturing method of the pixel structure according to embodiments described in the disclosure. Referring to FIG. 7, the manufacturing method of the pixel structure includes following Steps 301 to 303.

In Step 301, a plurality of thin film transistors are formed.

Specifically, the formed thin film transistors each include a gate electrode, a source electrode, a drain electrode, and an active area between the source electrode and drain electrode, where the gate electrode of the thin film transistor is located above the source electrode and the drain electrode (the thin film transistor with a top-gate structure), or located below the source electrode and the drain electrode (the thin film transistor with a bottom-gate structure), which is not limited thereto.

In Step 302, a plurality of data lines and a plurality of scan lines are formed, where a plurality of pixel units are formed by intersecting the plurality of data lines with the plurality of scan lines, and each of the pixel units includes a thin film transistor.

In Step 303, a plurality of pixel electrodes are formed, a pixel electrode is formed in each of the pixel units, where the pixel electrode includes a plurality of slits, with at least one of the plurality of slits having a corner, and in a column of pixel units, a pixel electrode of each pixel unit in a row is electrically connected to a thin film transistor of a pixel unit in a preceding adjacent row, and the corner of the pixel electrode close to the thin film transistor extends toward the thin film transistor.

In embodiments, a corner of a pixel electrode of each pixel unit in a row is close to a thin film transistor of a pixel unit in a preceding adjacent row, a corner of a pixel electrode overlaps and is insulated from the scan line for controlling the thin film transistor.

Figure 8:
FIG. 8 is a schematic diagram of the structure of an array substrate according to embodiments described in the disclosure.

Embodiments of the disclosure provide an array substrate. FIG. 8 is a schematic diagram of the structure of the array substrate according to embodiments described in the disclosure. Referring to FIG. 8, the array substrate includes a glass substrate 41 and a pixel structure 42 which can be the pixel structure according to the above embodiments.

Figure 9:
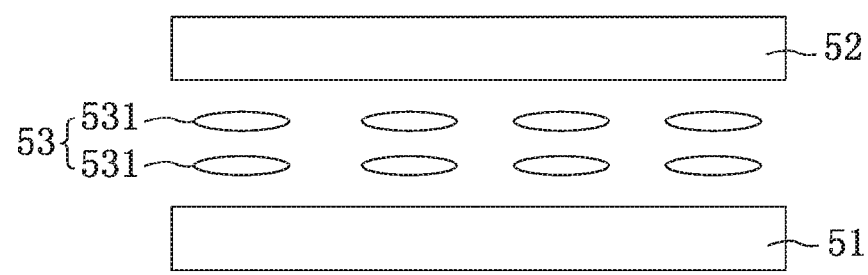
FIG. 9 is a schematic diagram of the structure of a display panel according to embodiments described in the disclosure.

Embodiments of the disclosure provide a display panel. FIG. 9 is a schematic diagram of the structure of a display panel according to embodiments described in the disclosure. Referring to FIG. 9, the display panel includes an array substrate 51, a color filter substrate 52 disposed opposite to the array substrate 51, and a liquid crystal layer 53 located between the array substrate 51 and the color filter substrate 52. The liquid crystal layer 53 is formed of liquid crystal molecules 531. The array substrate 51 can be the array substrate according to the above embodiments.

It is noted that the above display panel can have or not have a touch sensing function, depending on requirements. The touch sensing function can be an electromagnetic touch sensing function, a capacitive touch sensing function or an electromagnetism and capacitance integrated touch sensing function.

Figure 10:
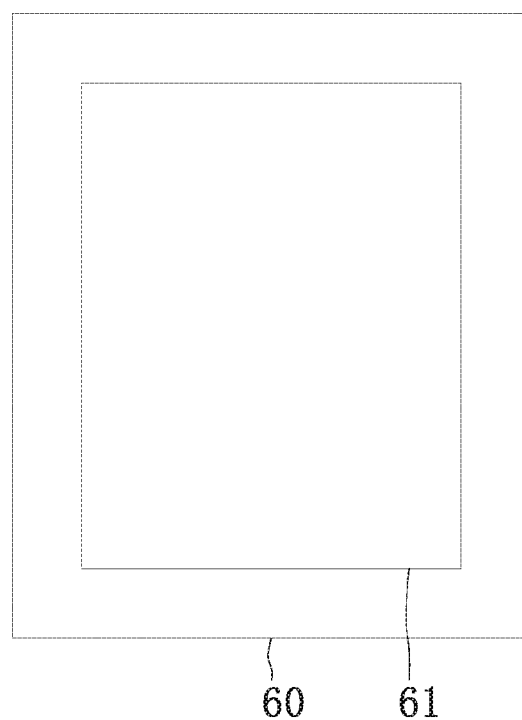
FIG. 10 is a schematic diagram of the structure of a display device according to embodiments described in the disclosure.

Embodiments of the disclosure provide a display device 60. FIG. 10 is a schematic diagram of the structure of a display device 60. Referring to FIG. 10, the display device 60 includes a display panel 61, and further includes a drive circuit and other devices for supporting a normal operation of the display device 60. The display panel 61 is the display panel according to the above embodiments. The display device 60 can be one of a cellphone, a desktop computer, a laptop computer, a tablet computer and an electronic paper.

In the pixel structure, the manufacturing method of the pixel structure, the array substrate, the display panel, and the display device according to embodiments of the disclosure, a pixel electrode of each pixel unit in a row is electrically connected to a thin film transistor of a pixel unit in a preceding adjacent row of the pixel electrode of the pixel unit, and the corner of the pixel electrode close to the thin film transistor extends toward the thin film transistor, and thus, the corner close to the thin film transistor can be completely covered by a black matrix in the color filter substrate after the color filter substrate is adhered to the array substrate, so that the number of the corners in the open area is reduced, and hence the light transmittance is improved while also decreasing a risk of a trace mura of the displayed image, thereby improving the display effect of the display panel and display device.

It is noted that the embodiments and the applied technology principles of the disclosure are merely described as above. It should be understood for those skilled in the art that the disclosure is not limited to particular embodiments described herein. Various apparent changes, readjustments and alternatives can be made by those skilled in the art without departing from the scope of the disclosure. Therefore, although the disclosure is illustrated in detail through the above embodiments, the disclosure is not merely limited to the above embodiments, and can further include more of other embodiments without departing from the disclosure. The scope of the disclosure is subject to the appended claims.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A pixel structure, comprising:
   a plurality of data lines and a plurality of scan lines; and
   a plurality of pixel units formed by intersecting the plurality of data lines with the plurality of scan lines,
   wherein the plurality of pixel units are arranged in rows and columns, every two adjacent rows are separated by only one of the plurality of scan lines,
   wherein the plurality of pixel units includes a first pixel unit and a second pixel unit, a pixel electrode of the first pixel unit is electrically connected to a thin film transistor (TFT) of the second pixel unit, and the pixel electrode of the first pixel unit has a slit, and
   wherein the slit has a corner close to the TFT of the second pixel unit, and the corner of the slit of the pixel electrode of the first pixel unit extends toward the thin film transistor of the second pixel unit.

2. The pixel structure of claim 1, wherein the first pixel unit is arranged in a first row, the second pixel unit is arranged in a second row adjacent the first row, the TFT of the second pixel unit is electrically connected to a corresponding one of the plurality of scan lines, and the pixel electrode of the first pixel unit overlaps and is insulated from the scan line that is electrically connected to the TFT of the second pixel unit.

3. The pixel structure of claim 2, wherein the second pixel unit is the closest one to the first pixel among pixel units in the second row.

4. The pixel structure of claim 1, wherein the plurality of pixel units are arranged in a staggered way.

5. The pixel structure of claim 4, wherein the first pixel unit is arranged in a first row, the second pixel unit is arranged in a second row adjacent the first row, and wherein the second pixel unit is located at one side of the first pixel unit and the corner of the slit of the pixel electrode of the first pixel unit extends towards the TFT in the second pixel unit; or the second pixel unit is located at another side of the first pixel unit and the corner of the slit of the pixel electrode of the first pixel unit extends towards the TFT in the second pixel unit.

6. The pixel structure of claim 5, wherein the corner of the slit of the pixel electrode of the first pixel unit bends toward the thin film transistor electrically connected to the pixel electrode.

7. The pixel structure of claims 1, wherein the plurality of pixel units are arranged in a matrix.

8. The pixel structure of claim 7, wherein the first pixel unit is arranged in a first row, the second pixel unit is arranged in a second row adjacent the first row, the first pixel and the second pixel unit are arranged in a same column, and the slit of the pixel electrode of the first pixel unit has a corner close to and extending towards the TFT of the second pixel unit.

9. The pixel structure of claim 7, wherein the pixel electrodes of any two pixel units in a same row are electrically connected to different two of the plurality of data lines.

10. The pixel structure of claim 1, further comprising a common electrode located between the pixel electrode of the first pixel unit and a film layer, the film layer includes a source electrode and a drain electrode of the thin film transistor of the second pixel unit, and the common electrode is insulated from the pixel electrode and the film layer.

11. The pixel structure of claim 1, wherein the pixel electrode is finger shaped.

12. The pixel structure of claim 1, wherein a distance between the pixel electrode of the first pixel unit and a pixel electrode of the second pixel unit is greater than or equal to 4μm, and less than or equal to 6μm.

13. The pixel structure of claim 1, wherein a source electrode of the thin film transistor of the second pixel unit is electrically connected to a corresponding one of the plurality of data lines; and a gate electrode of the thin film transistor of the second pixel unit is electrically connected to a corresponding one of the plurality of scan lines.

14. The pixel structure of claim 1, wherein the first pixel unit is arranged in a first row, the second pixel unit is arranged in a second row adjacent the first row.

15. The pixel structure of claim 1, wherein the slit of the pixel electrode of the first pixel unit overlaps with the scan line that is electrically connected to the thin film transistor of the second pixel unit.

16. The pixel structure of claim 1, wherein each of the plurality of pixel units is surrounded by two adjacent scan lines of the plurality of scan lines and two adjacent data lines of the plurality of data lines.

17. A manufacturing method of a pixel structure, comprising:

forming a plurality of thin film transistors;

forming a plurality of data lines and a plurality of scan lines, wherein a plurality of pixel units are formed by intersecting the plurality of data lines with the plurality of scan lines; and forming a plurality of pixel electrodes, with each pixel unit being provided with one of the plurality of pixel electrodes, wherein the plurality of pixel units are arranged in rows and columns, every two adjacent rows are separated by only one of the plurality of scan lines, wherein the pixel electrode comprises a slit, and wherein, a pixel electrode of a first one of the pixel units is electrically connected to a thin film transistor of a second one of the pixel units, and the first one is arranged in a first row, the second one is arranged in a second row adjacent the first row, and wherein the slit has a corner close to the TFT of the second pixel unit, and the corner of the slit of the pixel electrode of the first pixel unit extends toward the thin film transistor of the second pixel unit.

18. The manufacturing method of claim 17, wherein the pixel electrode of the first one of the pixel units overlaps and is insulated from a scan line for controlling the thin film transistor of the second one of the pixel units.

19. An array substrate, comprising a pixel structure, the pixel structure comprising:

a plurality of data lines and a plurality of scan lines; and a plurality of pixel units formed by intersecting the plurality of data lines with the plurality of scan lines, wherein the plurality of pixel units are arranged in rows and columns, every two adjacent rows are separated by only one of the plurality of scan lines, wherein the plurality of pixel units comprises a first pixel unit and a second pixel unit, a pixel electrode of the first pixel unit is electrically connected to a thin film transistor (TFT) of the second pixel unit, and the pixel electrode of the first pixel unit has a slit, and wherein the slit has a corner close to the TFT of the second pixel unit, and the corner of the slit of the pixel electrode of the first pixel unit extends toward the thin film transistor of the second pixel unit.

20. A display panel, comprising an array substrate, the array substrate comprising a pixel structure, the pixel structure comprising:

a plurality of data lines and a plurality of scan lines; and a plurality of pixel units formed by intersecting the plurality of data lines with the plurality of scan lines, wherein the plurality of pixel units are arranged in rows and columns, every two adjacent rows are separated by only one of the plurality of scan lines, wherein the plurality of pixel units comprises a first pixel unit and a second pixel unit, a pixel electrode of the first pixel unit is electrically connected to a thin film transistor (TFT) of the second pixel unit, and the pixel electrode of the first pixel unit has a slit, and wherein the slit has a corner close to the TFT of the second pixel unit, and the corner of the slit of the pixel electrode of the first pixel unit extends toward the thin film transistor of the second pixel unit.

* * * * *